United States Patent [19]

Jayamanne et al.

[11] Patent Number: 5,172,756
[45] Date of Patent: Dec. 22, 1992

[54] HEAT SINK

[75] Inventors: D. Anthony R. Jayamanne, Carrying Place; Stephen S. Hall, Belleville; Agostino Cozzi, Corbyville, all of Canada

[73] Assignee: Northern Telecom Limited, Montreal, Canada

[21] Appl. No.: 720,216

[22] Filed: Jun. 21, 1991

[51] Int. Cl.$^5$ .............................................. H05K 7/20
[52] U.S. Cl. ................................. 165/80.3; 174/16.3; 361/386
[58] Field of Search ...................... 165/80.3; 174/16.3; 357/81; 361/383, 386

[56] References Cited

U.S. PATENT DOCUMENTS

| | | | |
|---|---|---|---|
| 3,011,105 | 11/1961 | LeBlanc | 165/80.3 X |
| 3,366,171 | 1/1968 | Scharli | 165/80.3 |
| 4,344,106 | 8/1982 | West et al. | 361/386 |
| 4,471,407 | 9/1984 | Sleder | 361/387 |
| 4,695,924 | 9/1987 | Wozniczka | 361/386 |
| 4,699,208 | 10/1987 | Wolf et al. | 165/47 |
| 4,972,294 | 11/1990 | Moses, Jr. et al. | 361/386 |

OTHER PUBLICATIONS

Author: Aavid Engineering, Inc.; Title: Catalog 1200 P. 1-114; Date: 1989; Place of publication: Laconia, N.H.

*Primary Examiner*—Allen J. Flanigan
*Attorney, Agent, or Firm*—Michael M. Sakovich

[57] ABSTRACT

Mounted on a circuit board in close proximity to nearby circuit components, a novel heat sink is configured to provide unobstructed tool access to one or more heat producing devices attached thereto. The heat sink includes a massive body member fastened to the circuit board, a support member upstanding from the body member and a radiator member formed integrally with both the support and body members for releasing heat to the environment. One or more mounting surfaces form part of the body member and are provided for mechanically attaching the heat producing devices to the heat sink with good thermal contact. Each mounting surface is inclined with respect to the circuit board such that any device attached to a mounting surface is accessible through an open space between the radiator member and the nearest component on the circuit board.

15 Claims, 3 Drawing Sheets

HEAT SINK

FIELD OF THE INVENTION

This invention relates to a heat management device and more particularly to a heat sink for accessibly mounting heat producing electronic components on a crowded circuit board.

BACKGROUND OF THE INVENTION

Heat management devices in the form of heat sinks are known in a multitude of configurations that are commonly used in the electronics industry to prevent overheating and consequent damage to heat producing solid state devices and the like. In this regard, all heat sinks have similar attributes, namely good heat conductivity, a body member attachable to a circuit board and to which the devices may be attached, and a finned radiator member for expelling heat received from the devices.

When a heat sink is used for an individual device, or for a small number of devices, it is often possible to position the heat sink such that a clear tool access thereto is available for either installing or removing one or more devices. This is required from time to time as when testing or replacing defective devices. There are occasions, however, especially on crowded circuit boards, that an advantageous placement of the heat sink is not feasible, in which case the removal and reinstallation of devices on the heat sink becomes problematic.

The aforedescribed problem is particularly severe in circuits where a longitudinally extended heat sink is used to separate and also electrostatically shield small signal control circuits from large current handling devices such as rectifiers and switches In this circumstance, the heat sink often partitions a circuit board in such a way that an advantageous placement of the heat sink for easy accessibility to its devices may not be feasible. This situation is especially aggravated when the circuit board is crowded with components which obstruct access to device mounting surfaces on the heat sink.

During manufacturing assembly, the foregoing type of circuit arrangement does not usually present a problem since devices would be initially mounted on the heat sink to form a separate subassembly and therefore would be readily accessible. Subsequently this subassembly would be installed on the circuit board followed by soldering electrical connections thereto. A major problem will occur later, however, for a quality control group of the manufacturer who may be required to remove either the entire heat sink subassembly or some number of components mounted on the circuit board in order to gain access to a defective device mounted on the heat sink. The problem is particularly exacerbated when service problems arise in the field where sophisticated desoldering equipment of the factory is unavailable.

SUMMARY OF THE INVENTION

Having regard to the aforedescribed problem relating to limitations of accessibility to electronic devices mounted on a heat sink, the present invention avoids this problem by providing a heat sink having a body member with a device mounting surface that is angularly disposed to provide unobstructed tool access thereto.

A further provision of the invention is a heat sink that may be conveniently used as a shield, separating large current conducting and switching components from small signal control components.

Another provision of the invention is a heat sink that is readily manufactured though an extrusion process.

The problems associated with the prior art may be substantially overcome and the foregoing provisions achieved by recourse to the invention which is a heat sink for accessibly mounting a heat producing electronic device on a circuit board in close proximity to at least one obstructing component mounted thereon. The heat sink comprises, in combination, a body member having a supporting surface for attachment to the circuit board, a radiator member in integral thermal contact with the body member, and an inclined mounting surface forming part of the body member for mechanically attaching the device thereto with good thermal contact, the mounting surface being angularly disposed relative to the supporting surface such that an axis normal to the mounting surface and in registry with the device extends through a space between the radiator member and the nearest obstructing component to provide unobstructed tool access to the device.

BRIEF DESCRIPTION OF THE DRAWINGS

The invention will now be more particularly described with reference to embodiments thereof shown, by way of example, in the accompanying drawings in which.

DETAILED DESCRIPTION OF THE PREFERRED EMBODIMENTS

Figure 1:
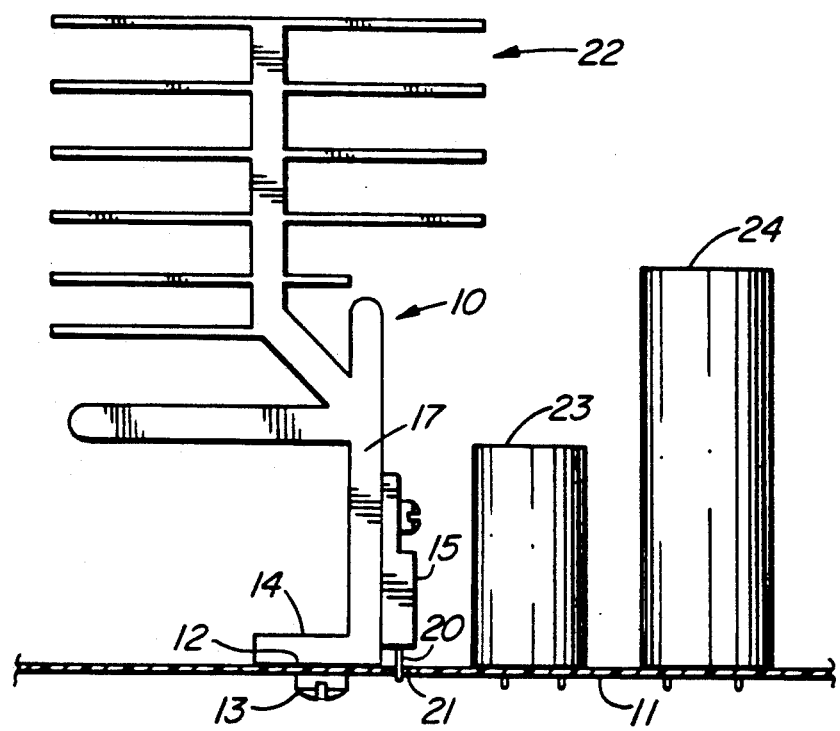
FIG. 1 is an end view of a heat sink mounted on a printed circuit board as is known in the prior art.

FIG. 1 illustrates an end view of a known heat sink 10 mounted on a circuit panel, shown as a printed circuit board 11. The heat sink 10 rests on its supporting surface 12 and is secured to the circuit board 11 using known fastening means. Such fastening means comprise a machine screw 13 that threadedly engages a corresponding threaded bore (not shown) formed in a base 14 of the heat sink 10.

The known function of the heat sink 10 is to prevent overheating in solid state devices such as rectifiers, current and voltage control devices, power amplifiers, and the like. In the example illustrated in FIG. 1, one such solid state device 15 is shown affixed to a vertical wall of a body member 17 of the heat sink 10 by means of a machine screw 16 that threadedly engages a corresponding threaded bore (not shown).

Connection leads 20 extend downwardly from the device 15 through apertures 21 in the board 11 for electrical connection to the printed wiring of the board 11.

Heat conducted from the device 15 to the body member 17 is communicated to a radiator member 22 of the heat sink 10. Heat from the member 22 is subsequently given up to the environment by radiation and convection in a known manner.

Figure 2:
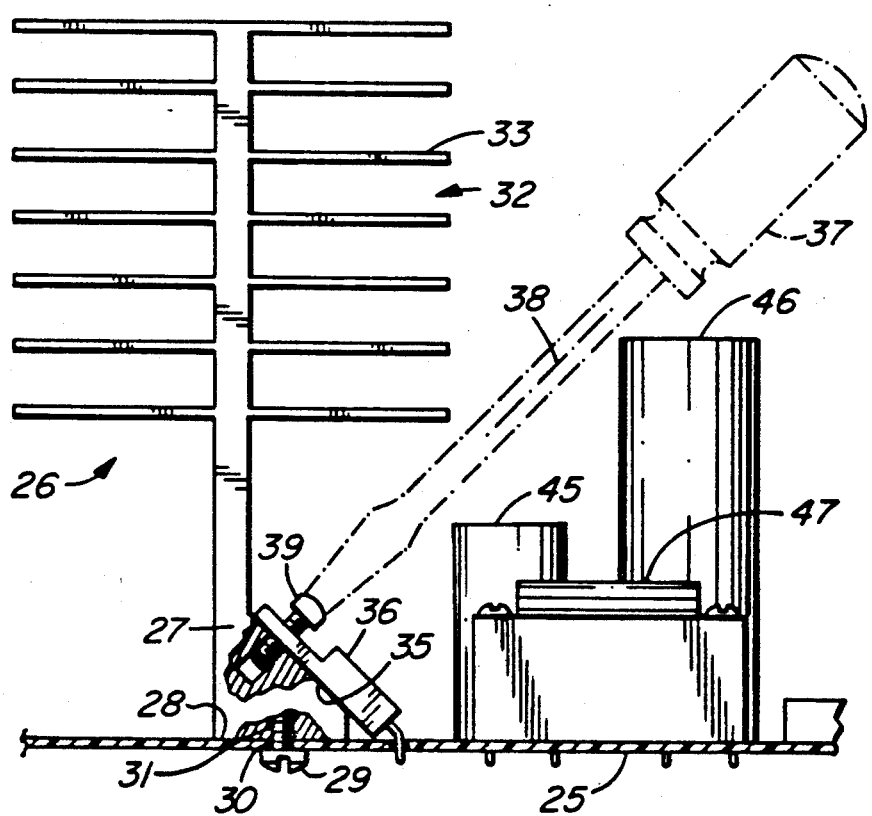
FIG. 2 is an end view of a heat sink in accordance with the invention shown mounted on a printed circuit board.

A problem commonly experienced with heat sinks of the prior art is one of inaccessibility to the device 15 for removal thereof in the event of failure. This particular problem arises from the presence of other circuit components which are often in obstructing proximity to the heat sink 10. FIG. 1 illustrates this problem by showing capacitors 23 and 24 in such obstructing proximity. It will be understood, therefore, that the old heat sink 10 design did not permit easy access for removing the device 15 because other large components tended to block screwdriver access The aforedescribed problem is resolved by recourse to the present invention, one embodiment of which is illustrated in FIG. 2 that shows a similar arrangement of components mounted on a printed circuit board 25 An end view of a heat sink 26 in accordance with the invention will be seen to comprise, in combination, a body member 27 having a flat supporting surface 28 that is attached to the board 25 by means of a machine screw 29. A cutaway portion of the body member 27 shows that the screw 29 passes through an aperture 30 of the board 25 and threadedly engages a corresponding threaded bore 31 in the body member 27.

A radiator 32 of the heat sink 26 is integrally formed with the body member 27 and includes a plurality of radiating fins 33 which are uniformly spaced apart in a vertically stacked array of horizontal planes that are substantially parallel to the supporting surface 28.

A significant departure from the heat sink of the prior art is shown in the heat sink 26 of FIG. 2 as comprising a device mounting surface 35 that is inclined and angularly disposed relative the supporting surface 28 such that substantially all axes normal to the surface 35 define a space intermediate the radiator member 32 and the nearest component mounted on the board 25. The surface 35 forms part of the body member 27 for mechanically attaching thereto a heat producing component shown as a solid state device 36. Unobstructed tool access to the surface 35 is graphically illustrated by means of a screwdriver 37, shown in broken line form. A long axis 38 of the screwdriver appears in line with a machine screw 39 and is normal to the surface 35. The axis 38 therefore comprises an access route to the screw 39 which is used to affix the device 36 to the body member 27 as shown, i.e., the threaded portion of the screw 39 extends through an aperture in the device 36 and engages a corresponding threaded bore 40 in the body member 27.

Shown in obstructing proximity to the heat sink 26 (FIG. 2) are a pair of upstanding tubular capacitors 45 and 46, together with a transformer 47. Having regard to heat sink technology of the prior art, which may be typified by the heat sink 10 of FIG. 1, it becomes apparent that these capacitors and transformer would block easy access to the screw 39 in the event that the device 36 had to be removed. However, by recourse to the heat sink 26 of the present invention, unobstructed tool access to the device 36 permits the screw 39 to be readily removed as illustrated. Subsequently, the device 36 would be unsoldered from the board 25 for removal. A substantial savings in repair time is thus effected since only the device 36 need be replaced without requiring removal of the heat sink 26 complete with its device 36 or any obstructing components attached to the board 25 as would be required in the case of the prior art heat sink 10. It is apparent in FIG. 1 that screwdriver access to the screw 16 would first require removal of the capacitors 23 and 24. The only feasible alternative would be to remove the entire heat sink assembly, provided that the there were no more connections to unsolder than those connections present on the capacitors 23 and 24.

Figure 3:
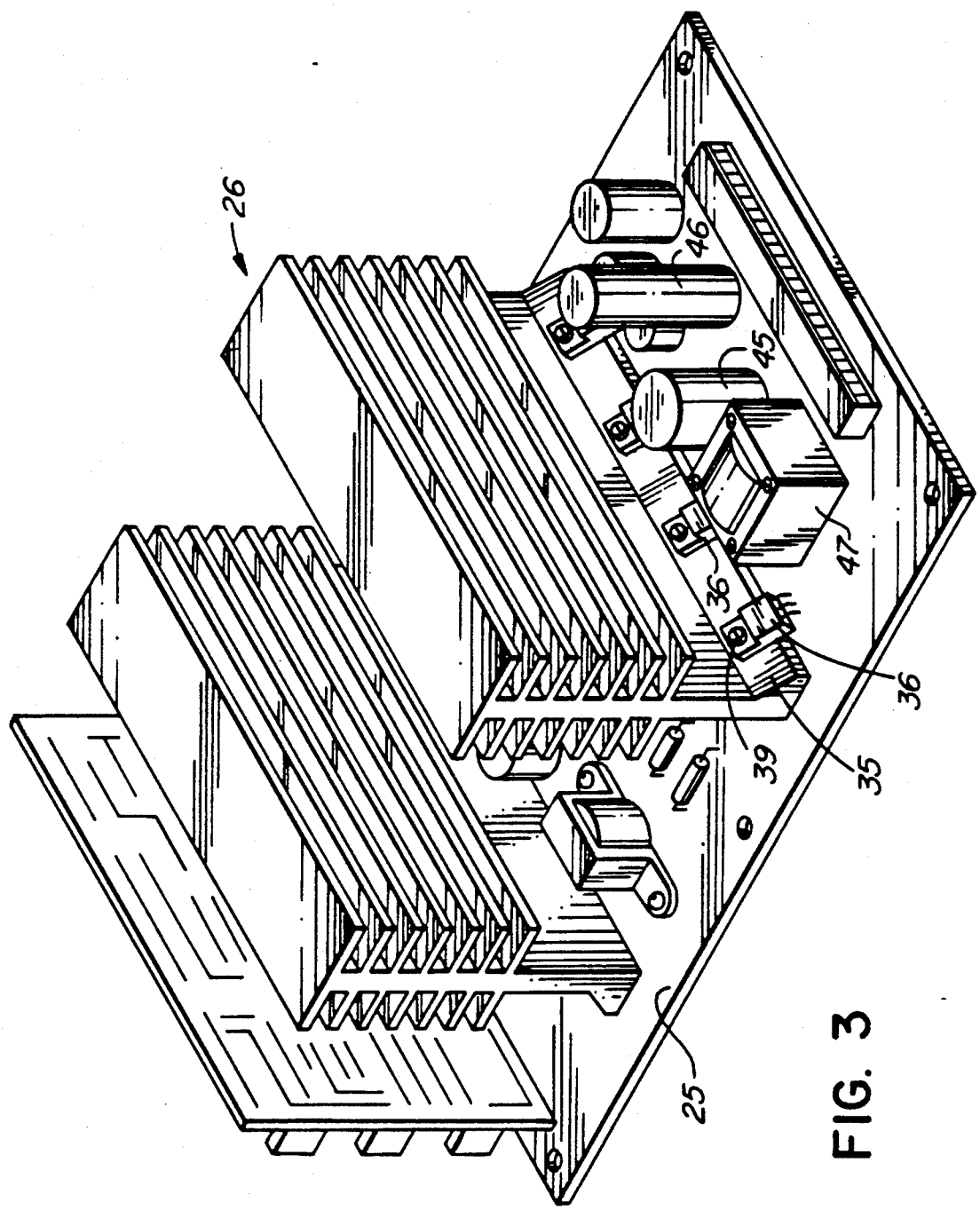
FIG. 3 is a perspective view of the heat sink of FIG. 2 shown in an application of separating and electrostatically isolating components on a printed circuit board.

FIG. 3 illustrates in an overall perspective view the problem of accessibility to a plurality of solid state devices 36 which, in the case of the prior art heat sink 10, would be inaccessible because of nearby circuit board components such as the capacitors 45 and 46 and the transformer 47. However, accessibility of the devices 36 is readily apparent from the inclined, device mounting surface 35 of the heat sink 26.

FIG. 3 typifies a heavy power supply circuit board 25 that may be partitioned on its component side by one or more extruded heat sinks 26. These heat sinks conveniently provide an electrostatic shield in the form of a metallic barrier between high current/voltage components of the board 25 and small signal lower voltage controlling logic elements thereof.

During the service life of the power supply, the devices 36 may from time to time fail. Since the cost of the circuit board is sufficiently high to justify repairs, such repairs are effected but become problematic when the difficulty of component obstruction arises. Having regard to the invention, however, screw 39 fasteners are more accessible to tools which permits a simpler and quicker repair as described hereinabove. Not only are individual device 36 replacements simpler, but the entire circuit board is at reduced risk of further damage since less handling is required. In this respect, individual devices 36 may be removed from the heat sink without disturbing nearby components mounted on the board 25.

Figure 4:
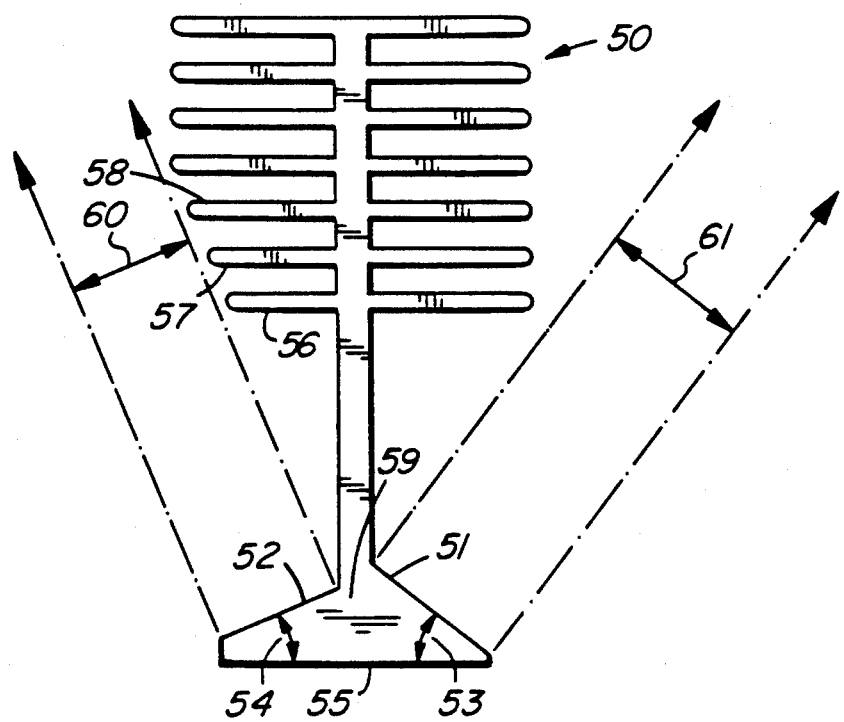
FIG. 4 is an end view of another embodiment of a heat sink in accordance with the invention.
Figure 5:
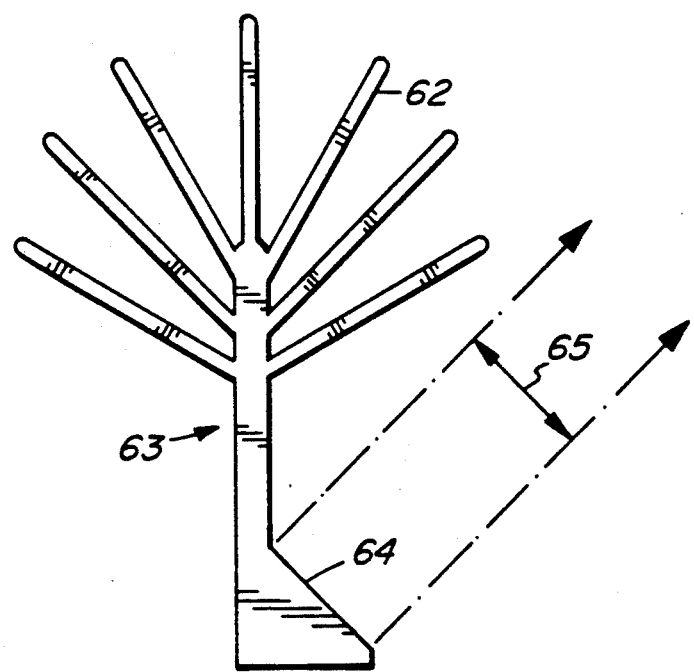
FIG. 5 is an end view of a further embodiment of a heat sink in accordance with the invention.

FIGS. 4 and 5 separately illustrate end views of two further embodiments of the invention. FIG. 4, for example, shows a heat sink 50 having two device mounting surfaces 51 and 52 which are placed back-to-back on opposite sides of a body member 59 and which are angularly set at different respective angles 53 and 54 relative a supporting surface 55 of the heat sink 50. To accommodate the difference in the angles 53 and 54, it will be observed that radiating fins 56, 57 and 58 are stepped as illustrated which permits a smaller angle 54 As regards the angle 54, it will be observed that a plurality of axes 60, which are normal to the surface 52, extend into the space intermediate the fins 56, 57 and 58, and the nearest component (not shown) mounted on the circuit board to provide a window of unobstructed tool access to the surface 52.

Similarly, a plurality of axes 61, which are normal to the surface 51, extend into the space between the radiator fins on that side of the heat sink 50 and the nearest component (not shown) to define the window of unobstructed tool access to the surface 51.

A further embodiment of the present invention is illustrated as an end view in FIG. 5 and shows a radially disposed arrangement of radiating fins 62 in a heat sink 63 having an inclined device mounting surface 64. A plurality of axes 65 define the window of unobstructed tool access in the same manner as described for the heat sink 50 of FIG. 4.

It will be understood that the angles 53 and 54 in the heat sink 50 may be set the same or differently to accommodate a particular problem of access to any one of the inclined, device mounting surfaces described. It has been determined, however, that a range of from about 22° to 65° will suffice in most cases, although the angle may be set as required depending upon the proximity and size of obstructing components in order to establish the aforedescribed window of unobstructed tool access to the device mounting surface.

To those skilled in the art to whom this specification is addressed, it will be apparent that the embodiments aforedescribed may be varied to meet particular specialized requirements as indicated without departing from the true spirit and scope of the invention disclosed. The embodiments of the invention herein described are therefore not to be taken as indicative of the limits thereof, but rather as exemplary structures of the invention which is described by the claims appended hereto.

The embodiments of the invention in which an exclusive property or privilege is claimed are defined as follows:

1. Heat sink apparatus for accessibly mounting heat producing electronic devices having bent leads on a circuit board in close proximity to a plurality of obstructing components mounted thereon, comprising in combination:
   a circuit board adapted to mount the components;
   a plurality of the heat producing devices; and
   a heat sink supportably mounting the devices and comprising,
   a body member, said member being longitudinally extended to function as a partition between selected ones of components mounted on the circuit board and having a supporting surface attached to the board;
   a radiator member in integral thermal contact with the body member and adapted to function cooperatively therewith as a continuous electrostatic shield between the selected ones of components; and
   an inclined mounting surface forming part of the body member on which the devices are mechanically attached in good thermal contact and with the bent leads positioned in substantially vertical registry with corresponding apertures in the board for establishing electrical contact with the circuit thereof, the mounting surface being angularly disposed relative to the supporting surface such that an axis normal to the mounting surface and in registry with individual ones of the devices extends through a space between the radiator member and the nearest obstructing component to provide unobstructed tool access to the devices.

2. A heat sink as claimed in claim 1, further comprising first attachment means for affixing individual ones of the devices to the inclined mounting surface.

3. A heat sink as claimed in claim 2, further comprising second attachment means for securing the body member to the circuit board.

4. A heat sink as claimed in claim 3, wherein the body member comprises a massive block having low thermal resistance.

5. A heat sink as claimed in claim 4, wherein the radiator member comprises an integral support member and a plurality of fins extending outwardly therefrom.

6. A heat sink as claimed in claim 5, wherein the body and radiator members are disposed in a substantially vertical plane with the radiator member being positioned above the body member.

7. A heat sink as claimed in claim 6, wherein the body and radiator members are unitarily formed as an extruded entity.

8. A heat sink as claimed in claim 7, wherein the first attachment means comprises, a first threaded bore in the body member, a first mounting screw adapted to threadedly engage the first threaded bore, and an aperture formed in the device through which the mounting screw extends to affix the device on the inclined mounting surface.

9. A heat sink for accessibly mounting a heat producing electronic device on a circuit board in close proximity to at least one obstructing component mounted thereon, comprising in combination:
   a body member comprising a massive block having low thermal resistance and a supporting surface for attachment to the circuit board;
   a radiator member comprising an integral support member and a plurality of fins extending outwardly therefrom in integral thermal contact with the body member;
   first and second inclined mounting surfaces forming part of the body member and disposed back-to-back on opposite sides thereof for mechanically attaching the device to either surface with good thermal contact, each mounting surface being angularly disposed relative to the supporting surface such that an axis normal to either mounting surface and in registry with the device extends through a space between the radiator member and the nearest obstructing component to provide unobstructed tool access to the device;
   first attachment means for affixing the device on a selected one of the inclined mounting surfaces; and
   second attachment means for securing the body member to the circuit board.

10. A heat sink as claimed in claim 9, wherein the first and second inclined mounting surfaces are set at unequal angles relative to the supporting surface.

11. A heat sink as claimed in claim 9, wherein the first and second inclined mounting surfaces are set at equal angles relative to the supporting surface.

12. A heat sink as claimed in claim 10, wherein the respective angles of the first and second inclined mounting surfaces are set at an angle within the range of from 22° to 65°.

13. A heat sink as claimed in claim 8, wherein the plurality of radiator fins are individually disposed in a set of horizontal planes disposed in spaced vertical relation.

14. A heat sink as claimed in claim 8, wherein the plurality of radiator fins are radially distributed about the upstanding free end of the support member.

15. A heat sink as claimed in claim 8, wherein the second attachment means comprises, a second threaded bore in the body member, and a second mounting screw adapted to threadedly engage the second threaded bore via an aperture formed in the circuit board through which the second mounting screw extends for attaching the heat sink thereto.

* * * * *